United States Patent
Ljungblad (10) Patent No.: US 7,110,159 B2
(45) Date of Patent: Sep. 19, 2006

(54) METHOD AND APPARATUS FOR PATTERNING A WORKPIECE AND METHODS OF MANUFACTURING THE SAME

(75) Inventor: Ulric Ljungblad, Mölndal (SE)

(73) Assignee: Micronic Laser Systems, Taby (SE)

( * ) Notice: Subject to any disclaimer, the term of this patent is extended or adjusted under 35 U.S.C. 154(b) by 0 days.

(21) Appl. No.: 11/008,566

(22) Filed: Dec. 10, 2004

(65) Prior Publication Data

US 2005/0128565 A1   Jun. 16, 2005

Related U.S. Application Data

(60) Provisional application No. 60/537,887, filed on Jan. 22, 2004, provisional application No. 60/529,114, filed on Dec. 15, 2003, provisional application No. 60/528,488, filed on Dec. 11, 2003.

(51) Int. Cl.
   *G02B 26/00* (2006.01)

(52) U.S. Cl. ............... 359/291; 359/290; 359/292
(58) Field of Classification Search ............... 359/291, 359/290, 292, 295, 297, 298, 238, 237, 872, 359/873, 874, 871
   See application file for complete search history.

(56) References Cited

U.S. PATENT DOCUMENTS

| 5,508,841 A | * | 4/1996 | Lin et al. .................... 359/318 |
| 6,624,880 B1 | | 9/2003 | Sandström et al. ........... 355/71 |

* cited by examiner

*Primary Examiner*—Hung Xuan Dang
*Assistant Examiner*—Tuyen Tra
(74) *Attorney, Agent, or Firm*—Harness, Dickey & Pierce, P.L.C.

(57) ABSTRACT

An apparatus for patterning a work piece including a source, and at least one reflective tilting surface adapted to induce a phase difference using at least one of a phase shifting plate and a difference in step height. A method corresponding to the apparatus for patterning a work piece. A method of manufacturing the apparatus for patterning a work piece and a Spatial Light Modulator, which may be included therein.

28 Claims, 9 Drawing Sheets

METHOD AND APPARATUS FOR PATTERNING A WORKPIECE AND METHODS OF MANUFACTURING THE SAME

CROSS-REFERENCE TO RELATED APPLICATIONS

This U.S. nonprovisional patent application claims priority under 35 U.S.C. § 120 of U.S. provisional Application 60/528,488, filed on Dec. 11, 2003, U.S. provisional application 60/529,114, filed on Dec. 15, 2003, and U.S. provisional application 60/537,887, filed on Jan. 22, 2004, the entire contents of each of which are hereby incorporated by reference.

BACKGROUND OF THE INVENTION

1. Field of the Invention

Example embodiments of the present invention relate to lithography.

2. Description of the Conventional Art

In conventional lithography systems, a spatial light modulator (SLM) may be used in pattern generation. Conventional SLM's may include tilting planar micromirrors. The micromirrors may be tilted in order to generate a pattern on a work piece. The writing quality of the conventional lithography systems may depend on the degree of planarity of the micromirrors. For example, the planarity of the micromirrors may decrease and the writing quality may decrease as a result thereof. An increase in the planarity of one or more micromirrors may provide for higher quality pattern generation. For example, one or more micromirrors may have a greater degree of planarity, and writing quality may improve. However, higher degrees of planarity (e.g., extreme or perfect planarity) may be difficult to achieve and/or cost ineffective.

Conventional tilting micro-mirrors may also have a reduced amount of negative amplitude. Negative amplitude may be useful since in enabling resolution enhancements. For example, full, or substantially full, negative amplitude may be used in chromeless phase lithography on masks in, for example, stepper technology. Full, or substantially full, negative amplitude may enable stronger phase shift effects, which may result in resolution enhancements.

SUMMARY OF THE INVENTION

In example embodiments of the present invention, introducing a phase difference in the electromagnetic radiation from tilting micro-mirrors may extend the addressable amplitude domain to encompass, for example, full, or substantially full, negative amplitude in addition to full, or substantially full, positive amplitude. This may enable full, or substantially full, phase-shift resolution enhancement techniques.

In example embodiments of the present invention, an even form around the tilting axis may serve as a non-planarity defect of a tilting micro-mirror. This even form may cause a reduction in contrast within a lithography system. Example embodiments of the present invention, which may introduce a phase difference, may increase the contrast for a non-flat micro-mirror, which may have even form.

An example embodiment of the present invention may provide a spatial light modulator comprising a substrate, at least one reflective surface, which may include at least two portions. The at least two portions induce a phase difference between a radiation reflected by the at least two portions. The phase difference may be induced by at least one of a phase plate and a phase step height difference between the at least two portions.

Another example embodiment of the present invention may provide a method of manufacturing a device for patterning a workpiece. A conductive layer, which may include a plurality of conductive areas with non-conductive areas disposed there between, may be formed on a substrate. A temporary layer may be formed on the plurality of conductive areas, which may include at least one non-conductive stopper. A reflective layer may be formed on the temporary layer. A material layer may be formed on at least two portions of the reflective layer.

Another example embodiment of the present invention may provide a method of manufacturing a reflective layer for use in a spatial light modulator. A temporary layer may be formed on a reflective surface. A portion of the temporary layer may be exposed to radiation and a remaining portion of the temporary layer may be unexposed. The unexposed or the exposed (depending on the type of resist, i.e., negative or positive) temporary layer may be removed and the remaining portion of the temporary layer and the reflective surface may be covered with a shifting material. The temporary layer and an associated part of the shifting material may be removed from a portion of the reflective surface.

Another example embodiment of the present invention may provide a method for patterning a workpiece. The method may include generating radiation, inducing a phase difference between at least the first portion and the second portion of the generated radiation, irradiating at least the first portion and the second portion of the radiation at the workpiece, and forming a pattern on the workpiece using the first and the second portions of the radiation.

Another example embodiment of the present invention may provide an apparatus for patterning a workpiece. The apparatus may comprise a source and at least one reflective device. The source may generate radiation and the at least one reflective device, may form a pattern on the workpiece and may induce a phase difference in the radiation. The phase difference may be induced by at least one of a phase shifting plate and a difference in step height.

In example embodiments of the present invention, the phase difference between the at least two portions of the radiation at the workpiece may be half of a wavelength of the radiation or, for example, $\lambda/2 \pm n^*\lambda$, where $\lambda$ is the wave length of the electromagnetic radiation and n is a natural number (e.g., 0, 1, 2, ... ).

In example embodiments of the present invention, the phase step height difference may be a quarter of the wavelength of the radiation or $\lambda/4 \pm (n^*\lambda/2)$, where $\lambda$ is the wave length of the electromagnetic radiation and n is a natural number (e.g., 0, 1, 2, ... ).

In example embodiments of the present invention, the at least one reflective surface may be a mirror.

In example embodiments of the present invention, the at least one mirror may be a planar or a non-planar mirror.

In example embodiments of the present invention, the plurality of reflective surfaces may be tiltable.

In example embodiments of the present invention, the radiation may be electromagnetic radiation and/or at least one of ultra violet and extreme ultra violet radiation.

In example embodiments of the present invention, the at least one phase plate may be transmissive or reflective.

In example embodiments of the present invention, the at least two portions of the at least one of the plurality of reflective surfaces may be adjacent.

In example embodiments of the present invention, the temporary layer may include a photo resist material.

In example embodiments of the present invention, the removing of the unexposed or exposed (which may depend on the type of resist, e.g., negative or positive) sensitive layer may further include applying a liquid solution and dissolving the unexposed or exposed (depending on the type of resist, e.g., negative or positive) temporary layer.

In example embodiments of the present invention, the temporary layer may further include an electromagnetic sensitive material.

In example embodiments of the present invention, the radiation may be in the form of light waves.

In example embodiments of the present invention, the at least one reflective device may further include a first portion and a second portion, which may reflect the radiation, and the radiation reflected by the first portion may be different in phase from the radiation reflected by the second portion.

In example embodiments of the present invention, the first portion and the second portion may have different phase step heights.

In example embodiments of the present invention, the step height of the first portion may differ from the step height of the second portion by a value, which may be equal, or substantially equal, to, for example, a quarter of the wavelength of the radiation.

BRIEF DESCRIPTION OF THE DRAWINGS

Example embodiments of the present invention will become more apparent with reference to the attached drawings in which.

DETAILED DESCRIPTION OF THE EXAMPLE EMBODIMENTS OF THE PRESENT INVENTION

Example embodiments of the present invention will be described more fully with reference to the accompanying drawings, in which example embodiments of the invention are shown. It should be understood, however, that example embodiments of the present invention described herein can be modified in form and detail without departing from the spirit and scope of the invention. Accordingly, the example embodiments described herein are provided by way of example and not of limitation, and the scope of the present invention is not restricted to the particular embodiments described herein.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

Figure 1:
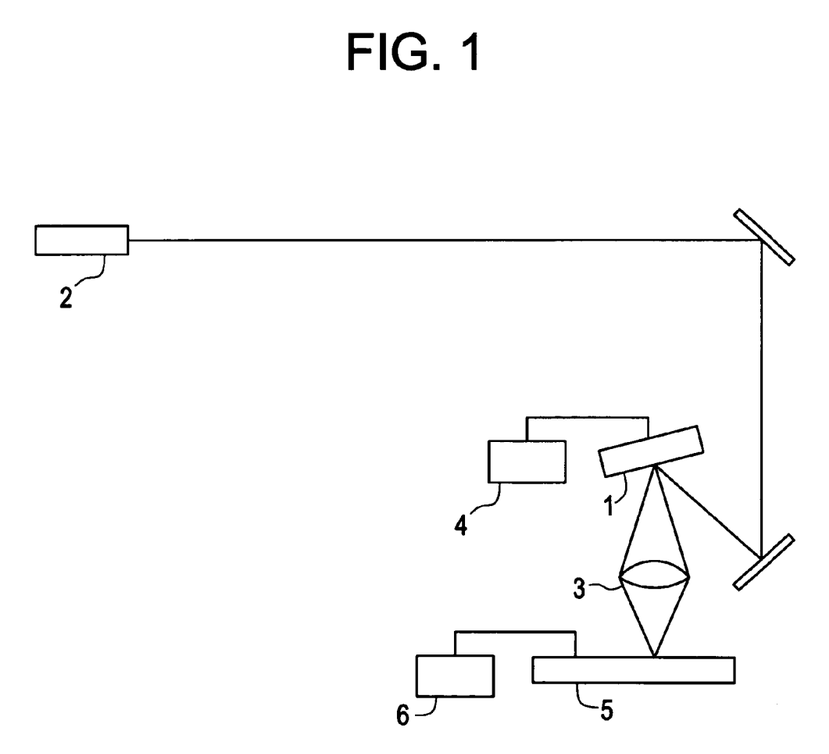
FIG. 1 illustrates an example embodiment of an apparatus for patterning a workpiece, according to the present invention.

Referring to FIG. 1, a system for generating a pattern on a work piece may include a pattern generator according to an example embodiment of the present invention. The pattern generator may comprise an SLM 1, which may include individual and/or multi-value pixel addressing, a source 2, an imaging system (e.g., an imaging optical system) 3, and a hardware and/or software data handling system 4. The system may further include a stage 5, for example, with a control system 6.

The SLM 1 may include reflective devices (i.e., micromachined mirrors or micromirrors). Reflective SLMs may rely on, for example, micromechanical SLMs. The micromechanical SLMs may use piezoelectric and/or electrostrictive actuation.

The SLM 1 may be irradiated by a source 2. The source 2 may be a KrF excimer laser, which may provide a 10–20 nanoseconds long radiation flash in the UV region at 248 nanometer wavelength, and may have a bandwidth corresponding to the natural linewidth of an excimer laser. To reduce pattern distortion on the substrate, the radiation from the source 2 may be distributed (e.g., uniformly distributed) over the surface of the SLM 1 surface and the light may have a coherent length, which may not produce laser speckle on the substrate 5.

The system of FIG. 1 may have a stage (e.g., a fine positioning substrate stage) 5 and may include a control system (e.g., an interferometer position control system) 6. In a first direction (e.g., the y-direction (not shown)) a mechanical system (e.g., a servo system) may keep the stage in a position and in second direction (e.g., the x-direction), which may be perpendicular to the first direction, the stage may move (e.g., mechanically move) with, for example, continuous speed. The control system 6, which may be used in the x-direction to trigger the exposure laser flashes, may provide uniform, or substantially uniform, position between images of the SLM 1 on the substrate 5. When a row of SLM images are exposed on the substrate 5, the substrate 5 may return to an original position in the x-direction and may move one SLM image increment in the-y direction and expose another row of SLM images on the substrate 5. This procedure may be repeated until the all, or substantially all, of the images on the substrate 5 may be exposed. The surface may be written in, for example, several passes and may average out errors.

The SLM 1 may include a plurality of reflective devices (e.g., micromirrors). The reflective devices may be manipulated (e.g., electrically) to reflect and/or diffract incoming radiation in a plurality of directions depending on a voltage, which may be applied (e.g., individually) to the reflective devices.

An example embodiment of the present invention may provide a method for modifying the shape of the reflective devices (e.g., micromirrors), which may achieve, for example, phase shifted addressing. The modified reflective devices may be used in example embodiments of the SLM 1, as described above with regard to FIG. 1. For example, example embodiments of the present invention provide a method of manufacturing a step height difference within a reflective device of an example embodiment of the SLM 1.

FIGS. 2a–2d illustrate example embodiments of modified reflective devices 400, 406, 408, and 410, which may be included in an example embodiment of the SLM 1, which may further be included in an example embodiment of an apparatus for patterning a workpiece according to the present invention. With regard to FIG. 2a, a reflective device 400 may be a planar micromirror device, which may include at least two portions 400A and 400B. Each of the portions 400A and/or 400B may have an underlying electrode 404. The portions 400A and 400B may each be half of the reflective device 400 and the electrodes 404 may be address and/or counter electrodes.

Figure 2A:
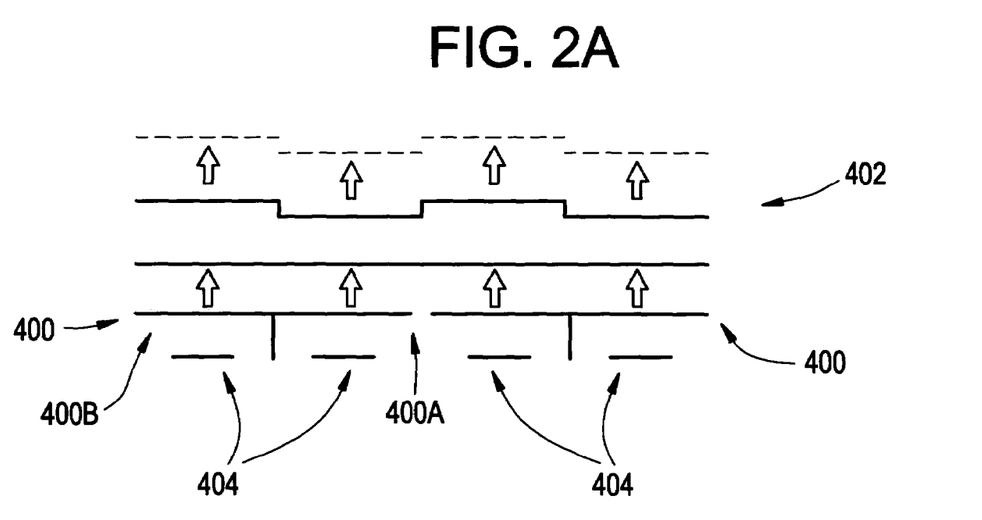
FIGS. 2a–2d illustrate example embodiments of modified reflective devices according to the present invention.

The electrodes 404 may manipulate (e.g., tilt and/or deform) the reflective device 400 in a plurality of ways as are discussed herein. The reflective devices may reflect radiation (e.g., electromagnetic radiation, light waves, etc.) irradiated at the reflective device 400 by the source 2. The source 2 may be, for example, an excimer laser, as illustrated in FIG. 1. A phase shifting plate 402 may be positioned, for example, between the reflective device 400 and the substrate 5, which may be, for example, a work piece for patterning. The phase shifting plate 402 may induce a phase shift in the radiation reflected by the portion 400A and the radiation reflected by the portion 400B. The phase difference between the reflected radiations may be equal, or substantially equal, to half of the wavelength of radiation, λ/2, relative to one another. The phase shift plate 402 may be comprised of, for example, quartz glass.

Figure 2B:
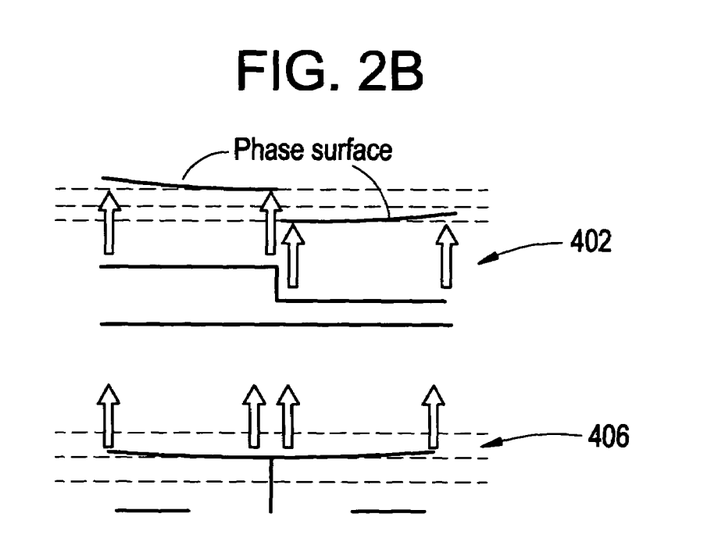

FIG. 2b illustrates another example embodiment of the present invention, which may be similar to that which has been described with respect to FIG. 2a, however, FIG. 2b may include a reflective device 406. Reflective device 406 may be a non-planar mirror or similar reflective surface. The reflective device 406 may be, for example, curved, as illustrated in FIG. 2b. The phase shifting plate 402 may be positioned, for example, between the reflective device 406 and a substrate (not shown), and may induce a phase difference between the radiation reflected by portions of the reflective device 406. The phase difference may be, for example, similar, or substantially similar, to the phase difference as described above with regard to FIG. 2a. The phase shift plate 402 may be comprised of, for example, quartz glass, although, the phase shift plate may be comprised of any suitable material.

Figure 2C:
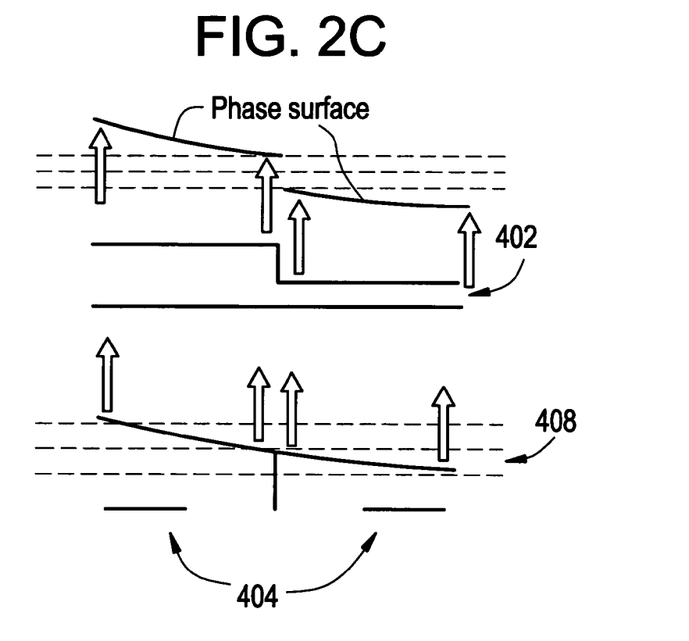

FIG. 2c illustrates another example embodiment of the present invention, similar to that which has been described with respect to FIG. 2b, however, FIG. 2c may include a reflective device 408, which may be a tilted non-planar mirror or similar reflective device. The reflective device 408 may be, for example, curved and tilted as discussed above and, further, in any way suitable to achieve a desired phase difference. A phase shifting plate 402 may be positioned, for example, between the reflective device 408 and a substrate (not shown), and may induce a phase difference between the radiation reflected by two portions of the reflective device 408. The phase difference may be similar, or substantially similar, to the phase difference as described above with regard to FIG. 4b.

Partially coherent reflected light for a mirror may be represented, for example, by a complex amplitude reflection coefficient which, for a tilting micro-mirror, may be obtained by integration over the deflected surface for a given tilt:

$$R = \oint_S r(x,y) \cdot e^{\frac{-i4\pi h(x,y)}{\lambda}} dx dy$$

where S is the surface of the mirror, λ is the wavelength, h is the local height and r is the local reflection. An intensity contribution from a mirror may be given by the square of the complex amplitude reflection coefficient for a given deflection. The complex amplitude trajectory in the complex amplitude space may be obtained by connecting all, or substantially all, complex amplitude reflection coefficients for the used mirror deflection angles. For example, for a flat tilting mirror with the tilt axis in balance, i.e. in the center of the mirror, the mirror may have symmetry, which may balance the average phase, while being deflected in a manner similar or substantially similar, to the way in which any phase modulation in the positive phase direction is counteracted with an equal, or substantially equal, phase modulation in the negative phase direction. The average phase may be preserved for all, or substantially all, tilt angles, which may lead to a complex amplitude trajectory on the real valued axis of the complex amplitude space. For any non-planarity of the mirror the symmetry may be broken and the complex amplitude trajectory may deviate (e.g., deviate in parts) from the real axis in complex amplitude space. Reaching the point R=0+0i (i.e., the origin) in the complex amplitude space for a non-planar mirror may not be possible without a phase step. An imaginary contribution to the complex amplitude trajectory may be the same, or substantially the same, as having remaining phase information in the final image leading to reduced performance of the lithography system. Available contrast may also be affected since the complex amplitude reflection coefficient may not reach 0+0i (i.e., the origin), and the intensity may not reach zero (=black) for any mirror deflection angle, for example, when a mirror without a phase step is non-flat (e.g., when the mirror is curved).

Introducing a phase step as illustrated in FIGS. 2b and 2c may change the situation, for example, a non-tilted non-planar mirror with a shape that may be described by a mathematically even form with respect to the tilt axis the phase symmetry, may be re-established and the imaginary contributions from the two sides of the mirror may cancel one another. That is, the complex amplitude reflection coefficient may reach 0+0i (i.e., the origin) while maintaining higher contrast in the image. The phase step may further reduce the phase content in the final image over the entire complex amplitude trajectory from, for example, a minimum to a maximum intensity, which may result in leading to improved lithographic performance.

Figure 2D:
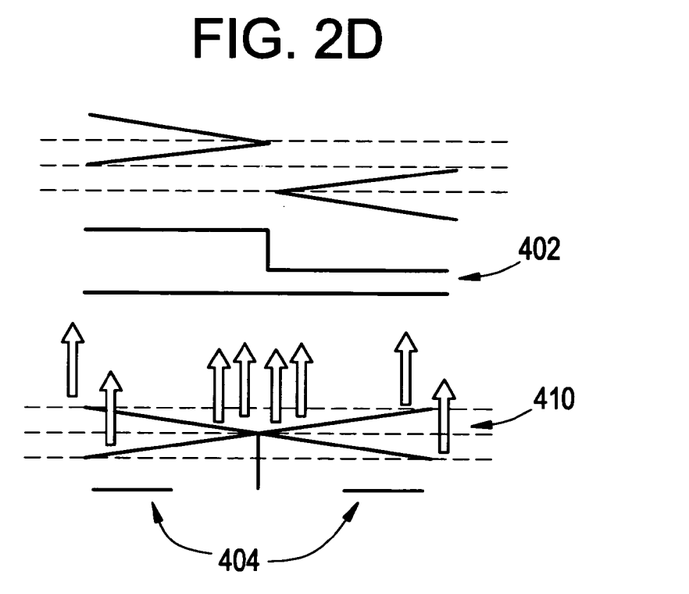

FIG. 2d illustrates another example embodiment of the present invention, similar to that which has been described with respect to FIG. 2a. FIG. 2d illustrates a tilted reflective device 410, which may be a planar mirror or similar reflective surface. The reflective device 410 may be tilted as discussed above and, further, in any angular direction and magnitude suitable to achieve a desired phase difference. A phase shifting plate 402 may be positioned, for example, between the reflective device 410 and a substrate (not shown), and may induce a phase difference between the radiation reflected by two portions of the reflective device 410. The phase difference may be similar, or substantially similar, to the phase difference as described above with regard to FIG. 2a. The phase shift plate 402 may be comprised of, for example, quartz glass.

Figure 3:
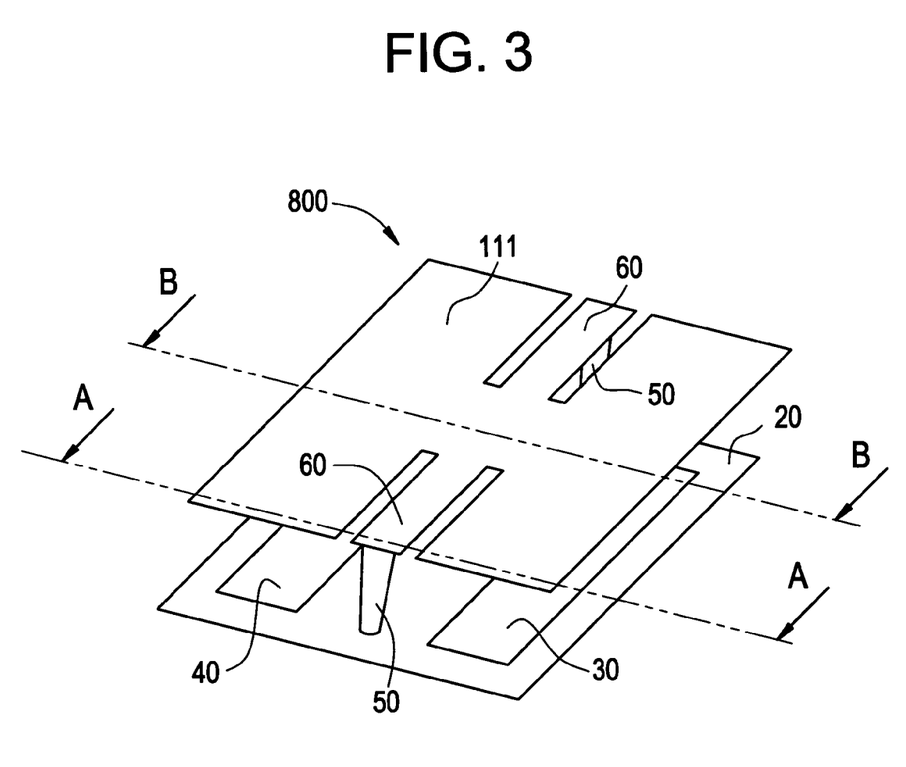
FIG. 3 illustrates another example embodiment of a reflective device, according to the present invention.

FIG. 3 illustrates an example embodiment of a movable microelement 800, according to the present invention, which may be manufactured using an example embodiment of the method as described above and may be included in the SLM 1 of FIG. 1. The movable microelement 800 may be, for example, a micro mechanical element. The movable microelement 800 may be, for example, a reflective element 111 in SLM 1. The reflective element 111 may be utilized in an analog mode, for example, to vary a degree of deflection of the reflective element 111 as a function of an electrical input, or, a digital mode, which may represent an ON and/or OFF state of the reflective element 111. The ON or OFF state may be defined by increased (e.g., maximum) deflection and/or no, or substantially no, deflection. In example embodiments of the present invention, an area 111, which may be similar, or substantially similar to area 100 as described above, may be a rectangular reflective element, which may be supported along at least one mid section by at least one e.g., (a pair) of hinges (e.g., torsional hinges) 60.

The reflective element 111 may be, for example, polygonal, circular, or elliptical, or any combination thereof. The hinges 60 may define an axis (e.g., a torsional axis) there along. The hinges 60 may extend from the reflective element 111 and may be supported by a support 50. The support 50 may rest on a substrate 20 and the reflective element 111. The hinges 60, the support 50 and/or the substrate 20 may be comprised of the same, or substantially the same, material. The material may be, for example, silicon, aluminum, another metal or any alloy or other combination thereof and may be, for example, etched out of a substrate, for example, using etching techniques, as desired by one of ordinary skill in the art. The substrate 20 may further include an electrode (e.g., an electrically conducting address electrode) 40 and/or an electrode (e.g., an optional electrically conducting counter electrode) 30. The electrode 40 and the electrode 30 may be connected to underlying circuitry (e.g., CMOS and/or address circuitry), which may be included in the substrate 20 (not shown). The electrodes 30 and/or 40 may be connected to capacitors, which may store the voltage (e.g., address voltage) addressed to the electrode 30 and/or 40.

The electrode 30 and/or the electrode 40 may be spaced apart (e.g., laterally) on the substrate 20 and may electrostatically attract the reflective element 111. The hinges 60 may rotate and/or twist with the reflective element 111 and may provide restoring force in the form of, for example, mechanical energy. When the same, or substantially the same, voltage, for example, ground, is applied on the reflective element 111, by the electrode 30 and/or the electrode 40, the reflective element 111 may be in a flat (e.g., undeflected) position, which may be referred to as an electrically unattracted state. The voltage may be shifted from the electrode 40 to the electrode 30 and the reflective element 111 may be rotated in a plurality of angular directions.

Figure 4:
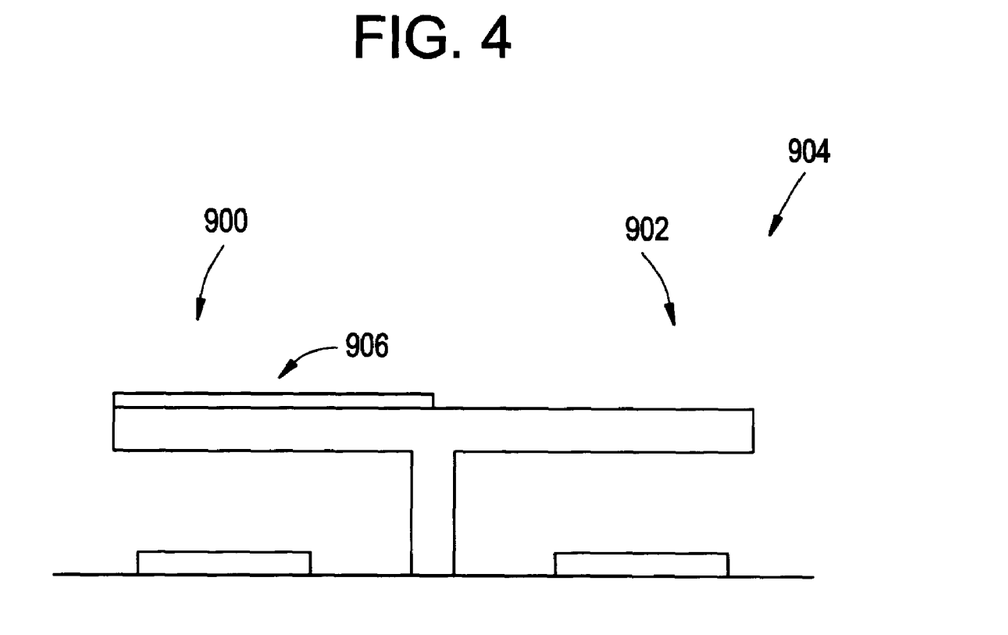
FIG. 4 illustrates another example embodiment of a reflective device, according to the present invention, which may include a step height difference.

FIG. 4 illustrates an example embodiment of a modified reflective device 904, according to the present invention. Phase shifted addressing may be achieved by manipulating, for example, the shape of the reflective devices on the SLM 1. The reflective element 904 may be modified by, for example, forming a layer of material 906, which may correspond to a desired shift of the phase of radiation reflected by a portion of the reflective device or devices 904 by 180 degrees or $\lambda/2$. The layer of material may be formed using, for example, a deposition process or any other suitable process. In another example embodiment of the present invention, a layer of material may be subtracted from a portion of the reflective device 904 in another process (e.g., a lithography, process, or any other suitable process), to obtain a desired phase shifting (not shown). The reflective device 904 may be formed such that a portion 900 of the surface of the reflective device 904 is, for example, $\lambda/4$ higher than another portion 902.

Phase shifted addressing may enable increased pattern resolution without changing other parameters of, for example, a lithography system or any other suitable system. An increased (e.g., full) phase shift may result when shifting (e.g., tilting) a portion (e.g., an edge) of reflective device 904, or 410, for example, between $-\lambda/4$ to $+\lambda/4$ using the addressing system. The addressing system may tilt the reflective device in multiple (e.g., opposite) directions. Light or electromagnetic radiation radiating from the different portions of the mirror may differ in phase by $\lambda/2 \pm n^*\lambda$, where n is a natural number (e.g., 0, 1, 2, . . . ). A difference in height of the different portions of the mirror may be $\lambda/4 \pm (n^*\lambda/2)$, where n is a natural number (e.g., 0, 1, 2, . . . ), although n may also be any suitable number. A tilting mirror without the phase step may allow negative amplitude up to approximately $-0.2$, which may correspond to a negative intensity of about $-0.05$. This may be sufficient to achieve feature resolution enhancement similar, or substantially similar, to attenuated phase shifting in steppers but may not achieve phase shifting similar, or substantially similar to an alternating phase shift mask.

With a phase step mirror the phase step may cancel amplitudes from, for example, the two mirror surfaces and may result in reduced (e.g., little or no) intensity (black) for non-deflection. Tilting the phase-step mirror one way may provide an amplitude trajectory in the positive real amplitude direction, for example, up to an amplitude of about $+0.7$ corresponding to an intensity of about $+0.5$. Tilting the phase-step mirror in another direction may provide a negative amplitude of, for example, about $-0.7$ corresponding to an intensity of about $-0.5$. Thus, for example, phase-step mirrors may require twice as much radiation dose as a mirror without phase step, but may allow for stronger phase shifting with preserved grayscaling.

FIGS. 5a–5e illustrate an example of a method of manufacturing a micro-electrical-mechanical-system (MEMS). FIGS. 5a–5e are examples of cross sections, which may be taken along line A in FIG. 3.

Figure 5A:
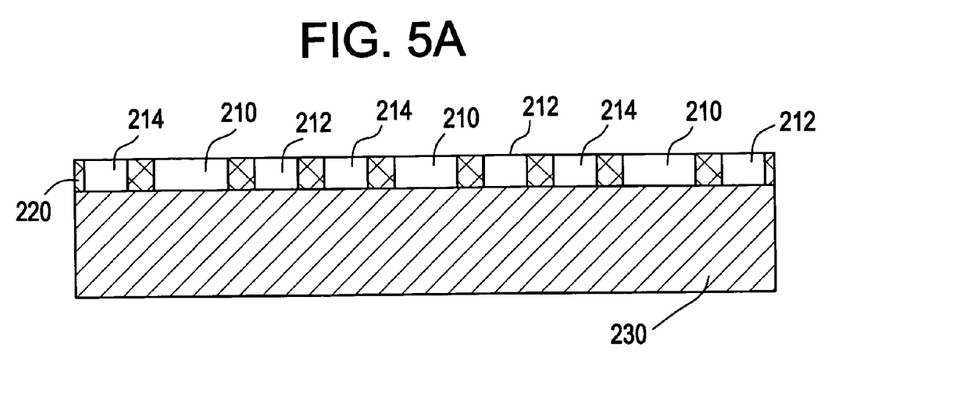
FIGS. 5a–5e illustrate an example embodiment of the method of manufacture viewed as a cross-section taken along line A of FIG. 3.

With regard to FIG. 5a, a substrate 230, which may be comprised of a semiconductor material (e.g., silicon). The substrate 230 may include complementary metal-oxide semiconductor (CMOS) circuitry and areas 210, 212, 214, which may be metal (e.g., aluminum, any alloy thereof, or any suitable metallic element) and areas 220, which may be, for example, silicon dioxide. The areas 220, which may be positioned between the areas 210, 212, 214 may separate (e.g., isolate) the areas 210, 212, 214. The areas 210 may form connections (e.g., electrical connections) to the reflective elements in, for example, the SLM 1. Areas 212 and/or 214 may form connections (e.g., electrical connections) to electrodes (e.g., address electrodes) or they may constitute electrodes themselves.

Figure 5B:
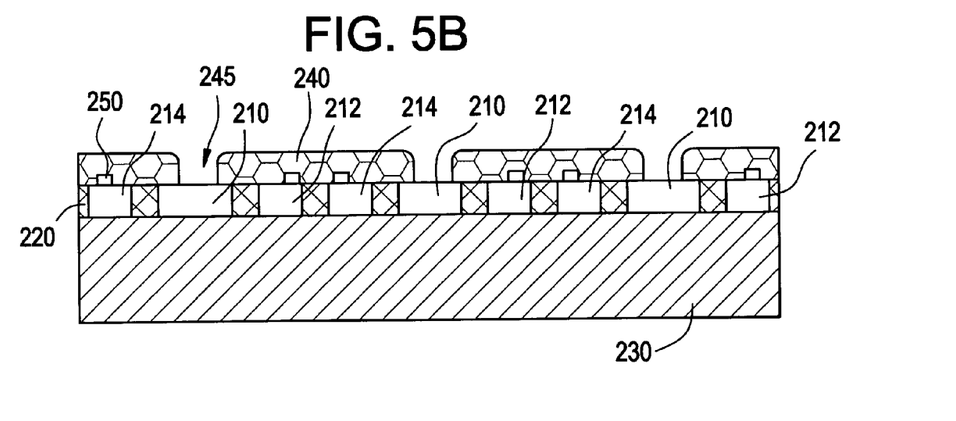

With regard to FIG. 5b, a layer 240 (e.g., a temporary layer) may be formed on the areas 210, 212, 214 and/or the areas 220. The layer 240 may be comprised of a radiation sensitive material (e.g., electromagnetic radiation sensitive material). Stopper 250 may be arranged within the layer 240 and may function as insulation (e.g., electrical insulation) for a reflective element. The stopper 250 may separate the reflective elements from the areas 210, 212, and 214 and/or from electrodes, and may reduce the likelihood of a short circuit. The stopper may be comprised of a non-conductive or insulating material, for example, silicon dioxide. The stopper may also be any suitable insulating material.

The area 245 disposed between the layers 240 may form support for the reflective element. For example, the area 245 may be circular, elliptical, rectangular or any other suitable shape. The area 245 between the layers 240 may be provided by, for example, a lithographic process or any other suitable process.

Figure 5C:
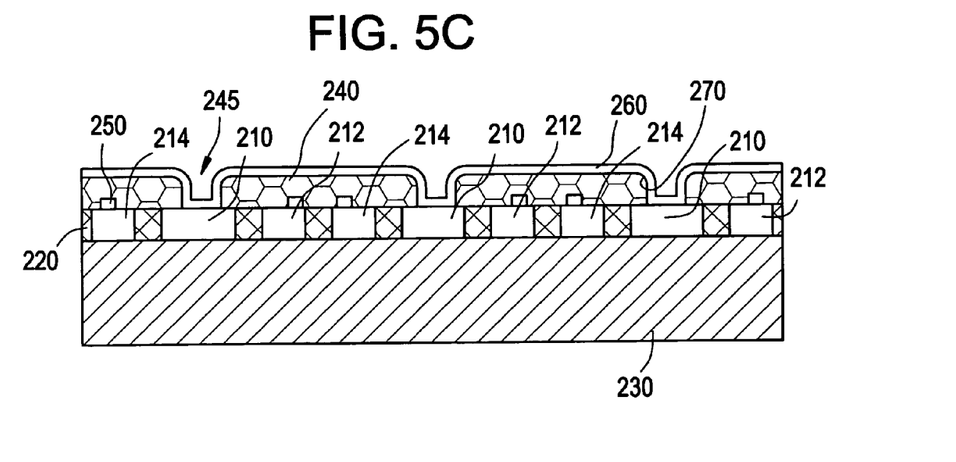

With regard to FIG. 5c, a layer (e.g., a reflective layer) 260 may be formed on the layers 240, on the areas 245, and/or on the areas 210.

The layer 280 may be applied and a step height difference within at least one reflective element in the SLM 1 may be formed.

Figure 5D:
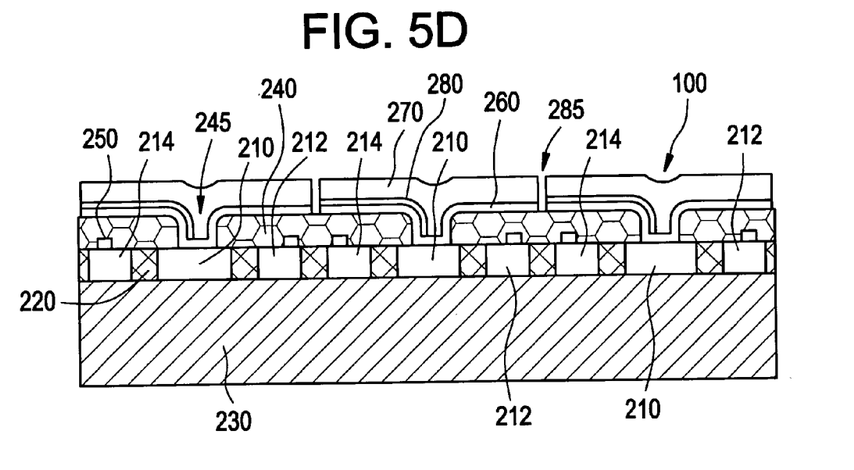

With regard to FIG. 5d, for example, a layer 270, which may be a photo resist, may be formed on the layer 260 and/or the layer 280. A space 285 may separate reflective elements from one another. The space 285 may be formed using, for example, any lithographic process or other suitable process, which may involve exposing, developing and/or etching.

Figure 5E:
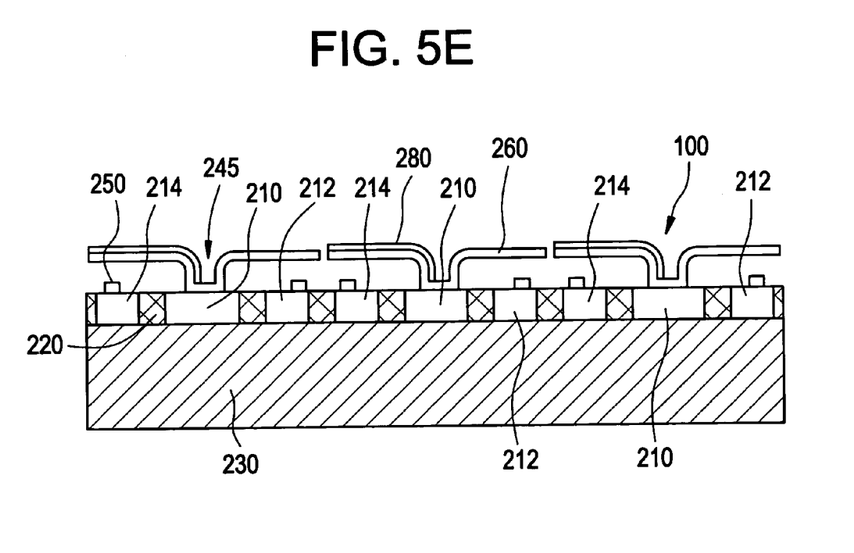

FIG. 5e illustrates an example of an example embodiment of the SLM 1. A layer 270 and/or a layer 240 may be removed by, for example, using a liquid solution process, dry etch process, or any other suitable process.

FIGS. 6a–6g are examples of cross sections, which may be taken along line B in FIG. 3. The cross sections may relate to the actuator.

Figure 6A:
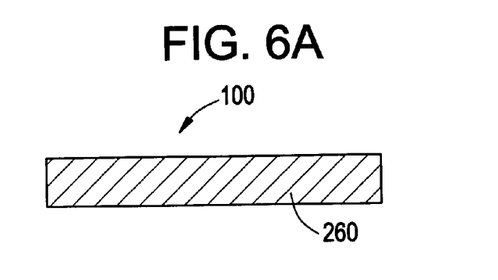
FIGS. 6a–6g illustrate an example embodiment of the method of manufacture viewed as a cross-section taken along line B of FIG. 3.

With regard to FIG. 6a, a cross section of a reflective area 100 of the layer 260 is illustrated, for example, prior to creating a step height difference.

Figure 6B:
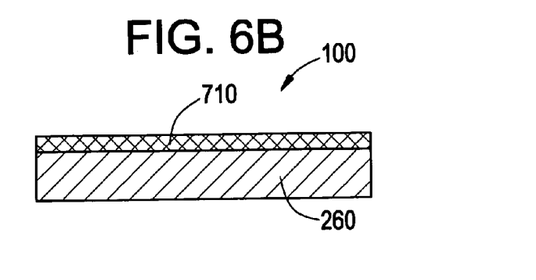

With regard to FIG. 6b, a layer (e.g., a material layer) 710 may be formed on the layer 260. An etch stop layer, for example, may be provided between the layer 710 and the layer 260. The etch stop layer may be silicon dioxide or any other suitable etch stop material. The layer 710 may be formed on the layer 260 by, for example, sputtering or any other conventional method as desired by one of ordinary skill in the art.

Figure 6C:
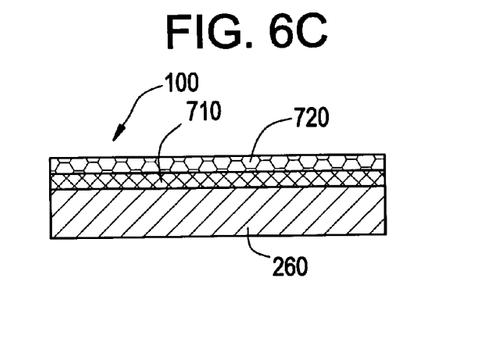
Figure 6D:
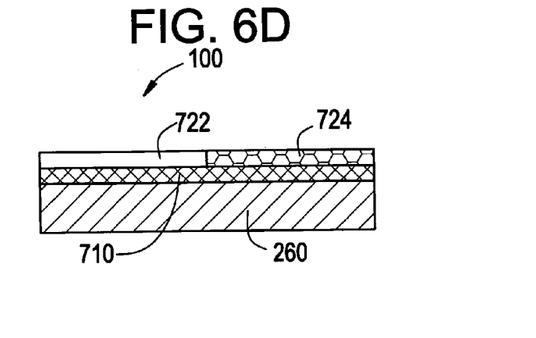

With regard to FIG. 6c, a layer (e.g., a temporary layer) 720, which may be sensitive to radiation (e.g., electromagnetic radiation), may be formed on the layer 710. The layer 720 may be, for example, a resist or a photo resist. With regard to FIG. 6d, a portion (e.g., half) 722 of the layer 720 may be exposed and a portion (e.g., half) 724 of layer 720 may not be exposed as described above.

Figure 6E:
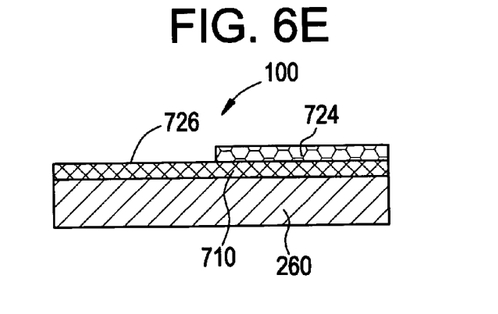

With regard to FIG. 6e, the portion 724, which may be the unexposed portion, of the layer 720 may remain on the layer 710, the portion 722 of the layer 720 may be removed, and a portion of the reflective area 100 may have an uncoated material layer.

Figure 6F:
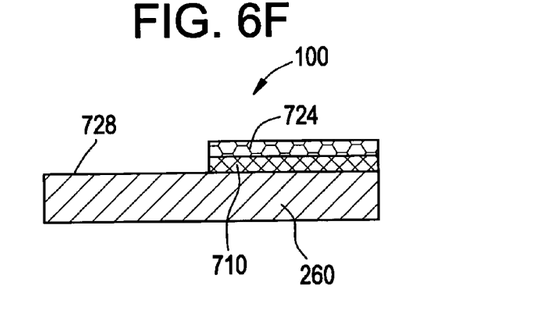

With regard to FIG. 6f, the uncoated portion of the layer 710 may be removed, for example etched away, and layer 720 may be removed from the area 100. The etching process may be dry based, wet based, or any other etching process as desired by one of ordinary skill in the art.

Figure 6G:
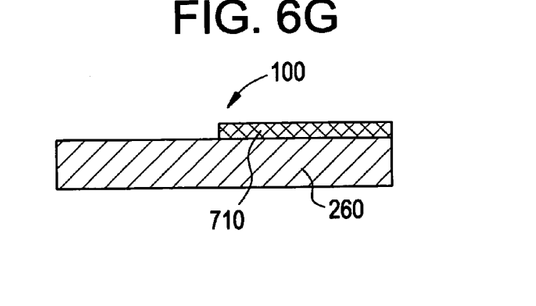

With regard to FIG. 6g, an area 100 may include a portion of the layer 260 with the layer 710 formed thereon. The unexposed layer on the portion 724 may be dissolved by a liquid solution.

Figure 7A:
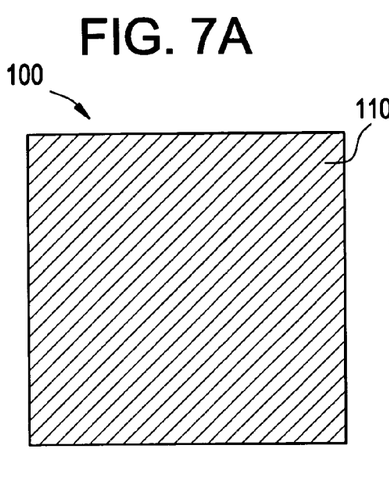
FIGS. 7a–7e illustrate a top view of an example embodiment of the method of manufacture.

With regard to FIG. 7a, the substrate 230 may include a plurality of areas 100 (e.g., reflective areas or pixels), which may form an example embodiment of the SLM 1. For example, the substrate 5 may include between 1 million and 10 million areas 100. A side of an area 100 may be between 8 microns and 16 microns. A step height difference within the area 100 may be formed and a plurality of areas 100 may be separated from one another. The area 100, as illustrated in FIG. 7a, may be covered with a layer 110, which may be sensitive to radiation (e.g., electromagnetic radiation). For example, layer 110 may be a resist. The layer 110 may be formed on the layer 260 according to, for example, any suitable method.

Figure 7B:
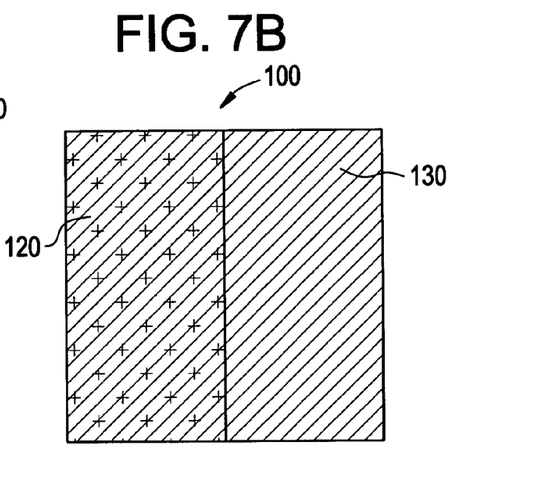

With regard to FIG. 7b, a portion (e.g., half) 120 of the area 100 may be exposed to a wavelength, to which the layer 110 may be sensitive. Another portion (e.g., half) 130 of the area 100 may not be exposed. Exposure may be done according to any suitable method, for example, using an electron beam pattern generator or a laser pattern generator, in which an electron beam (e-beam) or a laser beam may be scanned over the surface of the substrate, or a stepper using a photo mask.

Figure 7C:
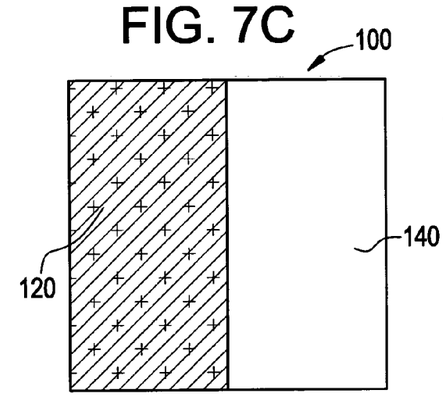

With regard to FIG. 7c, the layer 110 may be exposed and remain on the portion 120 of the area 100 and layer 110 may be removed from the portion 130 of the area 100. For example, a positive resist may be used such that the layer 110 may remain on the portion 130 of the area 100, for example, during developing.

Figure 7D:
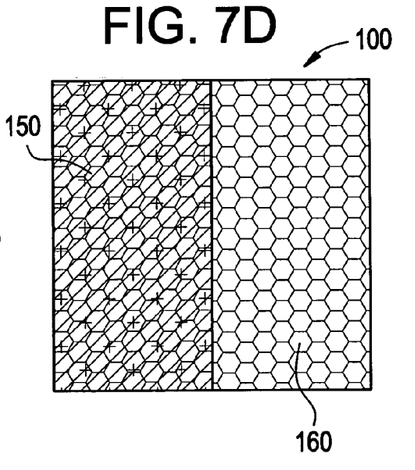

With regard to FIG. 7d, a portion 150 and a portion 160 may be covered with a material layer (denoted by hexagonal mosaic). The material layer may be formed by, for example, sputtering or any suitable process. In the portion 150 of the area 100, the material layer may be formed on the exposed layer 110. In the other portion 160 of the reflective area, the material layer may be formed on the layer 260. The material layer may have a thickness, which may be equal, or substantially equal, to a quarter of the wavelength of the radiation $\lambda/4$. The material layer thickness may also be any suitable thickness. For example, if an example embodiment of the SLM 1 is to be used as a modulator in a pattern generator, the wavelength may be, for example, 248 nm and the thickness of the material layer, which may be sputtered onto the area 100, may be, for example, 62 nm. If a different wavelength is used, another step height difference between the portions, for example, portions 150 and 160 of the area 100 may be used.

Figure 7E:
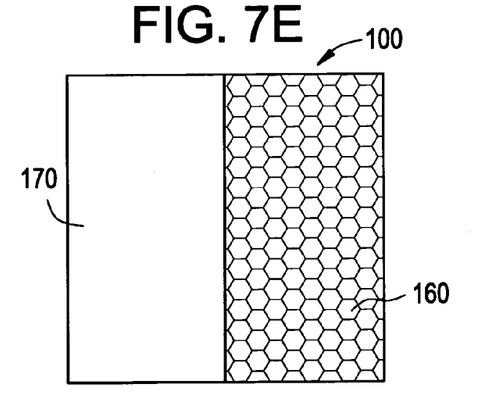

With regard to FIG. 7e, the material layer, which may be formed on the layer 110, may be removed in, for example, a lift-off process or any other suitable process. The portion 170 of the area 100 may be an uncovered portion of the area 100 and the portion 160 may be covered with the material layer. A step height between the portion 160 and the portion 170 of the reflective area 100 may be varied as desired according to the material, which creates the step height difference.

Example embodiments of the present invention may improve writing quality in, for example, a micro lithography system, which may use a Spatial Light Modulator (SLM). Example embodiments of the present invention may also improve the writing quality in, for example, micro-lithography systems, which may include reflective devices (e.g., mirrors, micromirrors, etc.), which are non-planar. Example embodiments of the present invention may also improve writing quality in any other suitable system.

In example embodiments of the present invention, it will be understood that a substrate, as described herein, may be comprised of any suitable material (e.g., glass, ceramic, metal, metal alloy, etc.) as desired by one of ordinary skill in the art.

Although example embodiments of the present invention have been described with regard to ultra violet (UV) light, it will be understood that any suitable light, which may have any suitable wavelength including extreme ultra violet (EUV), may be utilized by one of ordinary skill in the art.

While the present invention has been particularly shown and described with reference to example embodiments thereof, it will be understood by those of ordinary skill in the art that various changes in form and details may be made therein without departing from the spirit and scope of the present invention as defined by the following claims.

I claim:

1. A spatial light modulator comprising:
   a substrate;
   at least one reflective surface, including at least two portions, adapted to induce a phase difference between a radiation reflected by the at least two portions; wherein
   the phase difference is induced by at least one of a phase plate and a step height difference between the at least two portions.

2. The spatial light modulator of claim 1, wherein the phase difference between the at least two portions is $\lambda/2 \pm n*\lambda$, where $\lambda$ is a wavelength of the radiation and n is a natural number.

3. The spatial light modulator of claim 1, wherein the step height difference is $\lambda/4 \pm (n*\lambda/2)$, where $\lambda$ is a wavelength of the radiation and n is a natural number.

4. The spatial light modulator of claim 1, wherein the at least one reflective surface is a mirror.

5. The spatial light modulator of claim 4, wherein the mirror is a planar mirror.

6. The spatial light modulator of claim 4, wherein the mirror is a non-planar mirror.

7. The spatial light modulator of claim 1, wherein the at least one reflective surface are tiltable.

8. The spatial light modulator of claim 1, wherein the radiation is electromagnetic radiation.

9. The spatial light modulator of claim 1, wherein the radiation is at least one of ultra violet and extreme ultra violet radiation.

10. The apparatus of claim 1, wherein the phase plate is transmissive or reflective.

11. The apparatus of claim 1, wherein the at least two portions of the at least one reflective surface are adjacent.

12. A method of manufacturing a device for patterning a workpiece, the method comprising:
    forming, on a substrate, a conductive layer including a plurality of conductive areas with non-conductive areas disposed therebetween;
    forming a temporary layer on the plurality of conductive and non-conductive areas;
    forming a reflective layer on the temporary layer; and
    forming a material layer on at least one portion of the reflective layer.

13. A method of manufacturing a reflective layer for use in a spatial light modulator, the method comprising:
    forming a temporary layer on a reflective surface;
    exposing a portion of the temporary layer to radiation such that the portion of the reflective surface is exposed and a remaining portion of the temporary layer is unexposed;
    removing either the unexposed or the exposed temporary layer;
    covering the remaining portion of the temporary layer and the reflective surface with a shifting material; and
    removing the temporary layer and an associated part of the shifting material from a portion of the reflective surface.

14. The method of claim 13, wherein the temporary layer includes a photo resist material.

15. The method of claim 13, wherein the removing of the unexposed or exposed sensitive layer further includes,
    applying a liquid solution, and
    dissolving the unexposed or exposed temporary layer.

16. The method of claim 13, wherein the temporary layer further includes an electromagnetic sensitive material.

17. The method according to claim 13 wherein the shifting material is a transparent material.

18. The method according to claim 13 wherein the shifting material is a reflective material.

19. A method for patterning a workpiece including:
    generating radiation, including at least a first portion and at least a second portion, and reflecting at least the first portion and the second portion of the radiation toward the workpiece;
    inducing a phase difference between at least the first portion and the second portion of the radiation;
    irradiating at least the first portion and the second portion of the radiation at the workpiece; and
    forming a pattern on the workpiece using the first and the second portions of the radiation.

20. The method of claim 19, wherein the phase of the first portion differs from the phase of the second portion by $\lambda/2 \pm n*\lambda$, where $\lambda$ is a wavelength of the radiation and n is a natural number.

21. The method of claim 19, wherein the phase of the first portion differs from the phase of the second portion by $\lambda/4 \pm (n*\lambda/2)$, where $\lambda$ is a wavelength of the radiation and n is a natural number.

22. The method of claim 19, wherein the radiation is electromagnetic radiation.

23. The method of claim 19, wherein the radiation is in the form of light waves.

24. An apparatus for patterning a workpiece, the apparatus comprising:
    a source adapted to generate radiation;
    at least one reflective device, adapted to form a pattern on the workpiece and to induce a phase difference in the radiation; wherein
    the phase difference is induced by at least one of a phase shifting plate and a difference in step height.

25. The apparatus of claim 24, wherein the at least one reflective device further includes,
    a first portion and a second portion adapted to reflect the radiation and the radiation reflected by the first portion is different in phase from the radiation reflected by the second portion.

26. The apparatus of claim 25, wherein the phase of the radiation reflected by the first portion differs from the phase of radiation reflected by the second portion by $\lambda/2 \pm n*\lambda$, where $\lambda$ is a wavelength of the radiation and n is a natural number.

27. The apparatus of claim 25, wherein the first portion and the second portion have different step heights.

28. The apparatus of claim 27, wherein the step height of the first portion differs from the step height of the second portion by a value equal to $\lambda/4 \pm (n*\lambda/2)$, where $\lambda$ is a wavelength of the radiation and n is a natural number.

* * * * *